United States Patent
Peterson et al.

(10) Patent No.: US 12,062,529 B2
(45) Date of Patent: Aug. 13, 2024

(54) MICROWAVE RESONATOR ARRAY FOR PLASMA DIAGNOSTICS

(71) Applicant: Applied Materials, Inc., Santa Clara, CA (US)

(72) Inventors: David John Peterson, San Jose, CA (US); Chuang-Chia Lin, San Ramon, CA (US)

(73) Assignee: Applied Materials, Inc., Santa Clara, CA (US)

( * ) Notice: Subject to any disclaimer, the term of this patent is extended or adjusted under 35 U.S.C. 154(b) by 423 days.

(21) Appl. No.: 17/395,351

(22) Filed: Aug. 5, 2021

(65) Prior Publication Data

US 2023/0044262 A1  Feb. 9, 2023

(51) Int. Cl.
*H01J 37/32* (2006.01)

(52) U.S. Cl.
CPC .... *H01J 37/32917* (2013.01); *H01J 37/3222* (2013.01); *H01J 37/32899* (2013.01); *H01J 2237/24507* (2013.01); *H01J 2237/24585* (2013.01)

(58) Field of Classification Search
None
See application file for complete search history.

(56) References Cited

U.S. PATENT DOCUMENTS

| | | | |
|---|---|---|---|
| 2017/0023511 A1* | 1/2017 | Wilkinson | G01N 27/4163 |
| 2017/0221775 A1 | 8/2017 | Tedeschi et al. | |
| 2019/0113400 A1 | 4/2019 | Pillars et al. | |
| 2019/0187105 A1* | 6/2019 | Ram | G01N 29/2462 |
| 2019/0385875 A1 | 12/2019 | Wu | |
| 2023/0003598 A1* | 1/2023 | Lin | H03H 9/02015 |

FOREIGN PATENT DOCUMENTS

| | | |
|---|---|---|
| JP | 2010-232110 | 10/2010 |
| KR | 10-2019-0133926 | 12/2019 |

OTHER PUBLICATIONS

International Search Report and Written Opinion from Patent Application No. PCT/US2022/037626 dated Nov. 7, 2022, 11 pgs.
"Electron temperature measurements with a hairpin resonator probe in a pulsed low pressure capacitively coupled plasma," D. Peterson, et al., Plasma Sources Science and Technology, Jun. 17, 2021, 17 pgs.
International Preliminary Report on Patentability from PCT/US2022/037626 dated Feb. 15, 2024, 7 pgs.

* cited by examiner

*Primary Examiner* — Jany Richardson
(74) *Attorney, Agent, or Firm* — Schwabe, Williamson & Wyatt, P.C.

(57) ABSTRACT

Embodiments disclosed herein include sensor devices and methods of using the sensor devices. In an embodiment, a sensor device comprises a substrate, a support extending up from the substrate, and a resonator mechanically coupled to the support. In an embodiment, the sensor device further comprises an antenna that is configured to electromagnetically couple with the resonator, wherein the antenna is connected to a transmission line in the substrate.

20 Claims, 9 Drawing Sheets

MICROWAVE RESONATOR ARRAY FOR PLASMA DIAGNOSTICS

BACKGROUND

1) Field

Embodiments of the present disclosure pertain to the field of semiconductor processing and, in particular, to substrate based resonator arrays for determining plasma properties in a processing chamber.

2) Description of Related Art

Semiconductor manufacturing processes are often implemented in plasma environments. For example, plasma processing chambers are used to deposit material on a substrate (e.g. plasma enhanced chemical vapor deposition (PE-CVD), plasma enhanced atomic layer deposition (PE-ALD), physical vapor deposition (PVD), and the like). Additionally, plasma processing chambers may be used to remove material from a substrate in an etching process. Typically, metrology used to quantify a given process is limited to the end result of the process. That is, after a substrate is processed (e.g., with an etching or deposition process), metrology is used to determine how much material was added (e.g., in a deposition process) or removed (e.g., in an etching process).

Currently, the plasma itself can be monitored with systems such as optical emission spectroscopy (OES). OES can be used to determine some aspects of a plasma, such as plasma composition, for example. However, OES is limited in that it cannot account for properties of the plasma such as electron density, plasma (electron) temperature, or spatial differences in such properties.

Some probe architectures may be used to determine plasma properties. Microwave probe plasma diagnostics employ a coaxial transmission line design that presents a relatively large probe volume relative to the discharge that the probe is perturbing. As such, the probe itself may change the measured properties, and therefore, does not provide an accurate measure of the processing conditions.

SUMMARY

Embodiments disclosed herein include sensor devices and methods of using the sensor devices. In an embodiment, a sensor device comprises a substrate, a support extending up from the substrate, and a resonator mechanically coupled to the support. In an embodiment, the sensor device further comprises an antenna that is configured to electromagnetically couple with the resonator, wherein the antenna is connected to a transmission line in the substrate.

In an embodiment, a method of measuring a plasma with a sensor device comprises inserting a sensor substrate with a plurality of resonators into a chamber and reducing the pressure in the chamber. In an embodiment, the method further comprises measuring a first resonance profile of the plurality of resonators, initiating a plasma process, and measuring a second resonance profile of the plurality of resonators. In an embodiment, the method further comprises determining a plasma property by comparing the first resonance profile to the second resonance profile.

In an additional embodiment, a sensor device comprises a substrate, a plurality of supports extending up from the substrate, and a plurality of resonators, wherein individual ones of the plurality of resonators are coupled to an individual ones of the plurality of supports. In an embodiment, the sensor device may further comprise a plurality of antennas, wherein individual ones of the plurality of antennas are configured to couple with an individual one of the plurality of resonators, and wherein the plurality of antennas are connected to a single transmission line.

DETAILED DESCRIPTION

Substrate based resonator arrays for determining plasma properties in a processing chamber are described herein. In the following description, numerous specific details are set forth in order to provide a thorough understanding of embodiments of the present disclosure. It will be apparent to one skilled in the art that embodiments of the present disclosure may be practiced without these specific details. In other instances, well-known aspects are not described in detail in order to not unnecessarily obscure embodiments of the present disclosure. Furthermore, it is to be understood that the various embodiments shown in the Figures are illustrative representations and are not necessarily drawn to scale.

Embodiments disclosed herein include diagnostic substrates that enable the ability to measure plasma parameters, in real time, during a plasma process. For example, plasma parameters may include, but are not limited to, electron density and electron temperature. Particularly, the plasma parameters are measured by detecting changes in the resonance behavior of a resonator that is physically located within the plasma (e.g., raised above the surface of a substrate by at least the Debye length of the plasma).

In contrast to existing probe technologies, embodiments disclosed herein include a smaller perturbing volume introduced by the sensor device. Additionally the transmission line length required for measurement is reduced. Reducing the transmission line length permits the measurement of a larger range of conditions. Simultaneous measurement of spatially resolved quantities provides a single shot measurement capability that is not present with the traditional probe approach where the probe must be moved to different parts of the plasma discharge in order to make spatial measurements.

Figure 1:
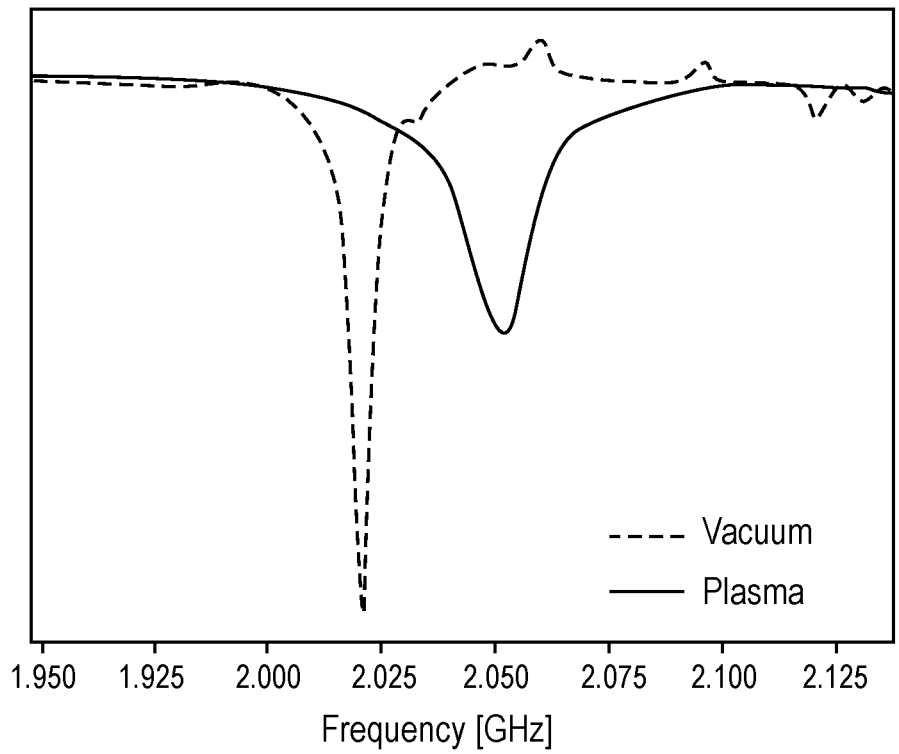
FIG. 1 is a graph of the reflected voltage versus frequency of a resonator in a vacuum and in a plasma, in accordance with an embodiment.

Referring now to FIG. 1, a graph of the resonance behavior of a sensor device is shown, in accordance with an embodiment. At vacuum (i.e., without a plasma being generated), the resonance behavior has a narrow peak. After the plasma is initiated, the peak shifts and the peak broadens. The peak shift and peak broadening compared to the vacuum behavior can be used to calculate plasma properties. For example, the shifting of the peak (i.e., a change in the resonant frequency) may be correlated with an electron density, and the broadening of the peak may be correlated with an electron temperature. Peak shift correlation with electron density occurs due to a modification of the local real permittivity detected by the resonator. Peak broadening is correlated with both electron density and electron temperature because plasma can be characterized as a lossy dielectric media that reduces the resonators ability to store electrical energy.

In order to detect the plasma properties, the sensing device needs to be raised above the surface of the underlying substrate. Generally, the height of the resonators needs to be raised by at least the Debye length of the plasma. An example architecture of a sensor device that may be integrated on a substrate is shown in FIG. 2A.

Figure 2A:
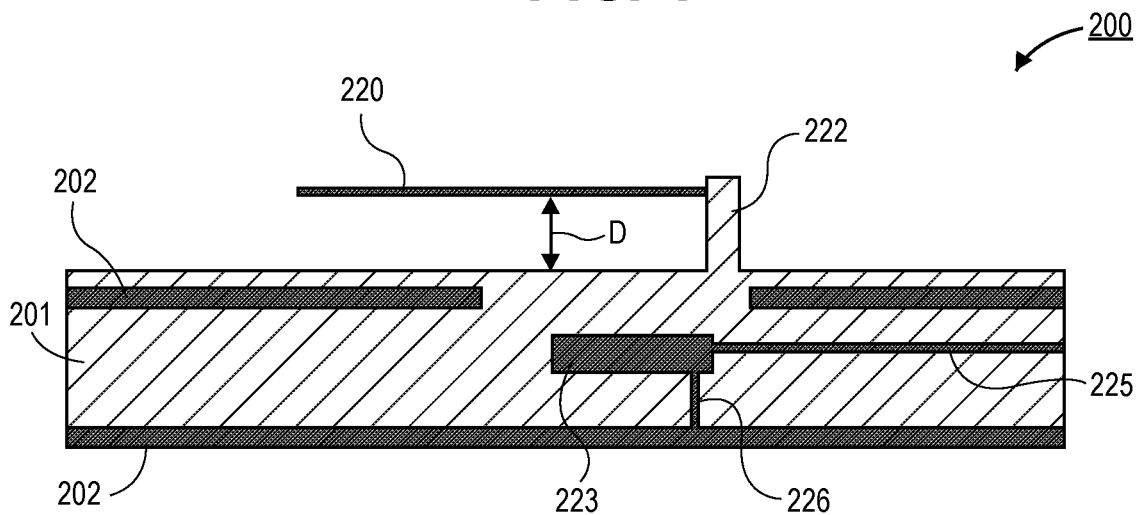
FIG. 2A is a cross-sectional illustration of a sensor device with a resonator attached to a support and an antenna to drive resonance of the resonator, in accordance with an embodiment.

Referring now to FIG. 2A, a cross-sectional illustration of a sensor device 200 is shown, in accordance with an embodiment. In an embodiment, the sensor device 200 may be provided on a substrate 201. The substrate 201 may be any substrate material common in semiconductor manufacturing environments. In a particular embodiment, the substrate 201 may be an organic package substrate material, similar to a printed circuit board (PCB) or other board materials. In an embodiment, the form factor of the substrate 201 may be a wafer form factor. Though it is to be appreciated that other form factors may also be used. In an embodiment, ground planes 202 may be provided in the substrate 201.

In an embodiment, the sensor device 200 may comprise a support 222. The support 222 extends up vertically from a surface of the substrate 201. The support 222 also holds the resonator 220. The resonator 220 is electrically isolated from the substrate 201 by the support 222. That is, the support 222 may be an electrically insulating material, such as an organic material. In some embodiments, the support 222 may be made from the same material as the substrate 201. In other embodiments, the support 222 may be a high temperature plastic (e.g., Teflon) or a ceramic material. The support 222 may raise the resonator 220 above the surface of the substrate 201 by a distance D. The distance D may be at least the Debye length of the plasma being investigated. In a particular embodiment, the distance D may be approximately 25 mm or smaller. In some embodiments, the distance D may be between approximately 1 mm and approximately 25 mm.

In an embodiment, the length of the resonator 220 (i.e., the distance between the support 222 and the opposite end of the resonator 220) may be chosen to provide a desired resonant frequency. For example, sensors with shorter resonator 220 lengths are tuned to have higher resonant frequencies than sensors with comparatively longer resonators 220. In an embodiment, the length of the resonator 220 may be between approximately 1 mm and approximately 40 mm. In an embodiment, the resonator 220 may be a conductive material. For example, the resonator 220 may comprise a copper wire. The wire of the resonator 220 may have a diameter that is approximately 1 mm or smaller. In a particular embodiment, a wire diameter of the resonator 220 may be approximately 0.5 mm or smaller.

In an embodiment, the sensor device 200 may further comprise an antenna 223. The antenna 223 may be configured to wirelessly couple with the resonator 220 in order to drive resonance in the resonator 220. For example, the antenna 223 may be configured to be inductively coupled with the resonator 220. In an embodiment, the antenna 223 may be buried within the substrate 201. Burying the antenna 223 protects the antenna from the processing environment. An opening through the top ground plane 202 may be provided between the resonator 220 and the antenna 223 to allow for the wireless coupling. In an embodiment, a signal trace 225 may be coupled to the antenna 223. Additionally, the antenna 223 may be coupled to a ground plane. For example, trace 226 may connect the antenna 223 to the ground plane 202. In an embodiment, the antenna 223 may be any antenna architecture. In a particular embodiment, the antenna 223 is a spiral antenna.

Figure 2B:
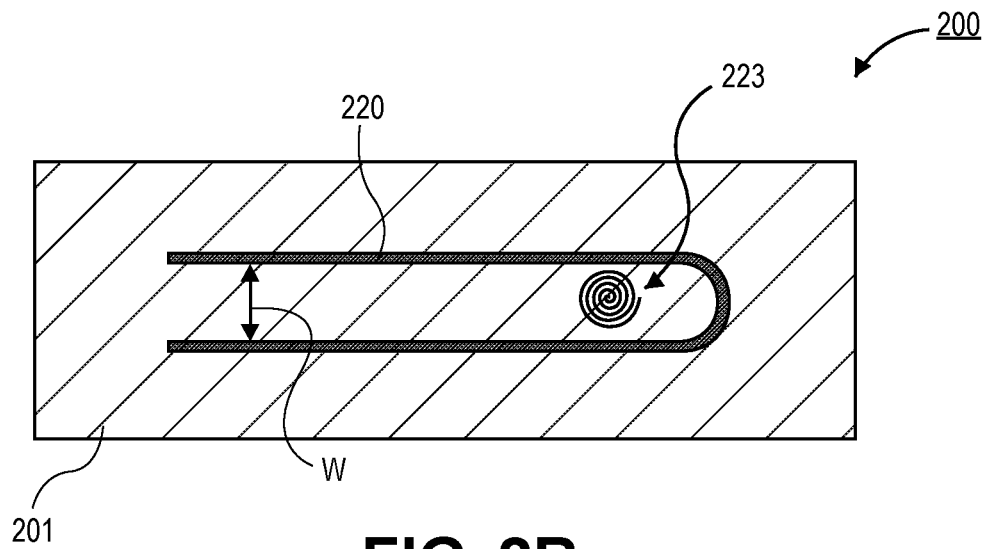
FIG. 2B is a plan view illustration of the sensor device that illustrates a hairpin shape over a spiral antenna, in accordance with an embodiment.

Referring now to FIG. 2B, a plan view illustration of the sensor device 200 is shown, in accordance with an embodiment. In an embodiment, the resonator 220 is shown as a hairpin resonator 220. That is, the resonator 220 comprises a U-shaped resonator with a pair of tines. In an embodiment, the tines may be separated from each other by a width W. The width W may be approximately 5 mm or smaller. In a particular embodiment, the width W may be between approximately 2 mm and approximately 4 mm. In FIG. 2B, the resonator 220 is shown as floating. However, it is to be appreciated that a support may secure the end of the resonator 220 proximate to the antenna 223.

As shown, the antenna 223 is a spiral antenna. The antenna 223 is provided below the resonator 220. In the illustrated embodiment, the antenna 223 is shown as being above the substrate 201. However, it is to be appreciated that the antenna 223 may also be buried within the substrate 201, similar to the embodiment described above in FIG. 2A.

Figure 2C:
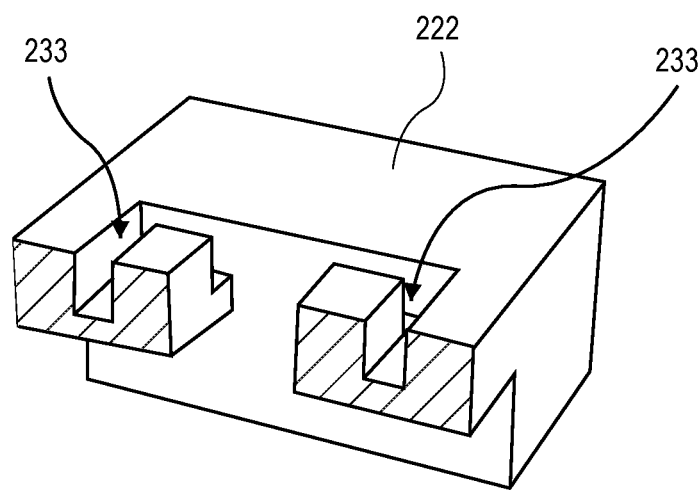
FIG. 2C is a perspective view illustration of a support for holding the resonator, in accordance with an embodiment.

Referring now to FIG. 2C, a perspective view illustration of a support 222 for holding the resonator 220 is shown, in accordance with an embodiment. As shown, the support 222 may comprise a pair of recesses 233. The recesses 233 are configured to hold the tines of the resonator 220. As shown, the recesses 233 are coupled together to form a U-shaped holder for the resonator. That is, the recesses 233 may be sized and shaped in order to conform to the shape of the resonator 220. For example, the recesses 233 may be spaced apart from each other by approximately 5 mm or less. In a particular embodiment, the recesses 233 may be spaced apart from each other by between approximately 2 mm and approximately 4 mm. In an embodiment, the support 222 may have a height that is between approximately 1 mm and approximately 25 mm.

In an embodiment, the support 222 may be an insulating material. In some embodiments, the support 222 is the same material as the substrate 201. In other embodiments, the support 222 is a high temperature plastic, such as Teflon. In yet another embodiment, the support 222 is a ceramic material. In an embodiment, the resonator 220 is placed into the recesses 233, and the resonator 220 is secured in the recesses 233 by an adhesive material. For example, an epoxy or the like may secure the resonator in the recesses 233.

Figure 2D:
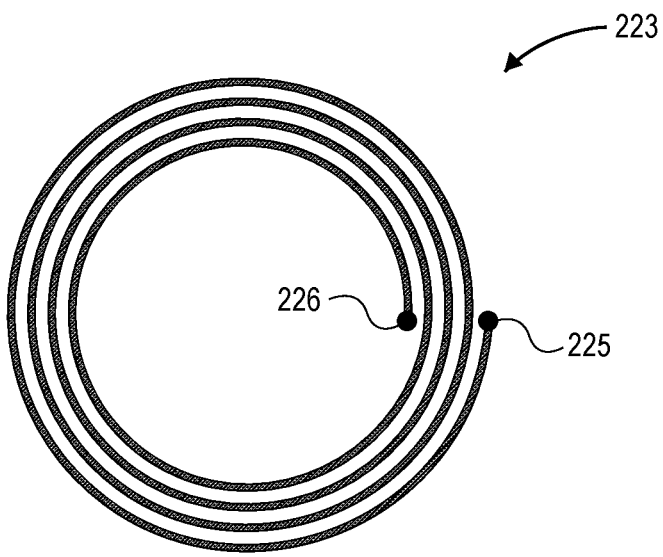
FIG. 2D is a plan view illustration of a spiral antenna that may be used to drive resonance in the resonator, in accordance with an embodiment.

Referring now to FIG. 2D, a plan view illustration of the antenna 223 is shown, in accordance with an embodiment. As shown, the antenna 223 may be a spiral antenna. While four rings are shown in the spiral antenna 223, it is to be appreciated that the spiral antenna 223 may comprise any number of rings. In an embodiment, a first end of the spiral antenna 223 is coupled to a signal trace 225 and a second end of the antenna 223 is coupled to a trace 226 that is coupled to one of the ground planes. The antenna 223 may be a conductive material, such as copper or the like. While a planar antenna 223 is shown, it is to be appreciated that embodiments are not limited to such configurations. For example, a non-planar antenna (e.g., a coil) may also be used in some embodiments.

Figure 2E:
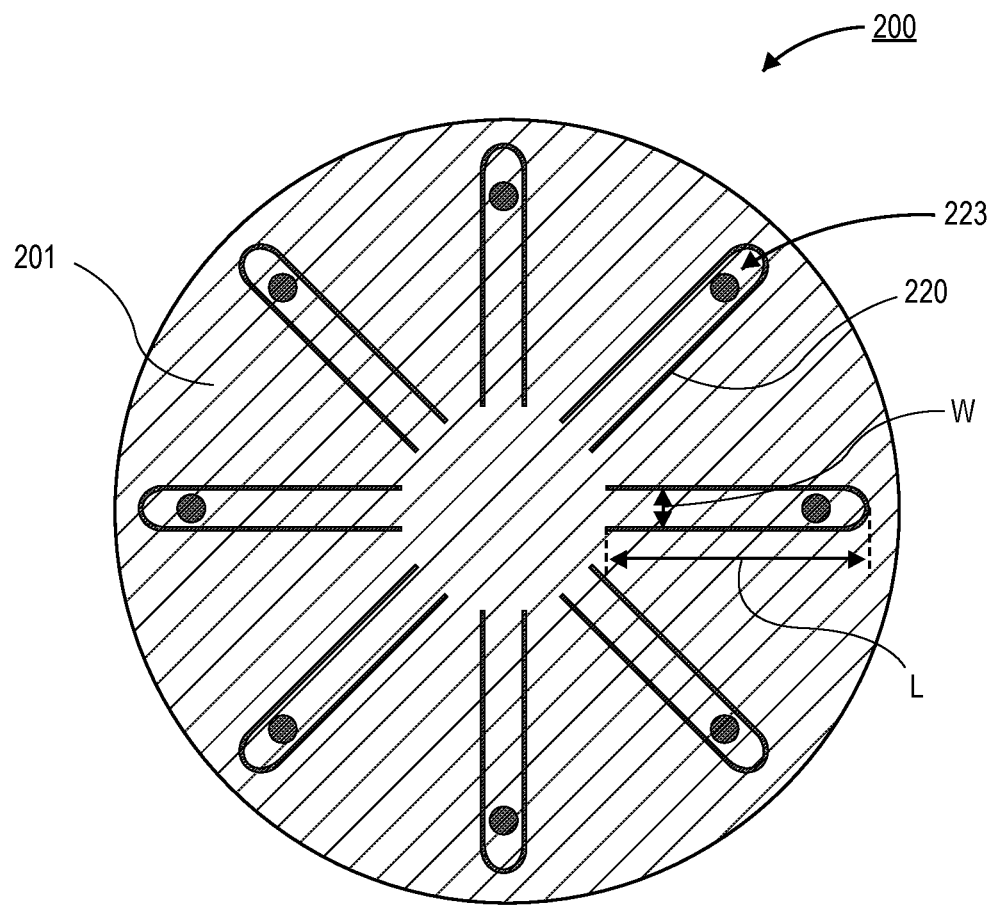
FIG. 2E is a plan view illustration of a substrate with a plurality of sensor devices distributed radially on a surface of the substrate, in accordance with an embodiment.

Referring now to FIG. 2E, a plan view illustration of a sensor device 200 is shown, in accordance with an embodiment. As shown, a plurality of sensors are arranged radially around a perimeter of the substrate 201. For example, the substrate 201 may have a wafer form factor, as shown in FIG. 2E. In an embodiment, each of the resonators 220 may have a closed end proximate to a perimeter of the substrate 201 and tines that extend towards a center of the substrate 201. In the illustrated embodiment, the support for holding the resonators 220 is omitted for simplicity. However, it is to be appreciated that each resonator 220 is secured by a support (e.g., similar to the support shown in FIG. 2C). An antenna 223 may be inductively coupled to each of the resonators 220. For example, the antennas 223 may be located within the tines towards the closed end of the resonators 220. In the illustrated embodiment, the antennas 223 are shown as being above the substrate 201. However, it is to be appreciated that the antennas 223 may be embedded within the substrate 201 in some embodiments. Embedding the antennas 223 within the substrate 201 may protect the antennas 223 from the processing environment. While shown without any electrical connections in the illustrated embodiment, it is to be appreciated that the antennas 223 may be coupled to a signal line and a ground plane.

In an embodiment, the resonators 220 may have any suitable form factor for detecting plasma properties. For example, the resonators 220 may have a length L. The length L may be between approximately 1 mm and approximately 40 mm. Though, it is to be appreciated that the length L may be smaller than 1 mm or larger than 40 mm in some embodiments. In an embodiment, the tines of the resonator 220 may be separated by a width W. In an embodiment, the width W may be less than approximately 5 mm. For example, the width W may be between approximately 2 mm and approximately 4 mm. Though, it is to be appreciated that the width W may also be larger than 5 mm or smaller than 2 mm in some embodiments. The geometry of the resonator 220 may be used to set a desired resonant frequency in the resonator 220. The resonant frequency may be higher than the frequency of the plasma that is being measured. For example, the resonant frequency may be set to be approximately 1 GHz or greater.

In the illustrated embodiment, the resonators 220 are shown as being hairpin resonators. That is, the resonators have a pair of tines that are coupled together at one end to form a U-shaped resonator 220. However, it is to be appreciated that resonators 220 are not limited to hairpin shaped resonators 220. That is, the resonators 220 may be any suitable RF resonator. The support for holding the resonator 220 may be modified to accommodate the structure of the resonator 220.

Figure 3A:
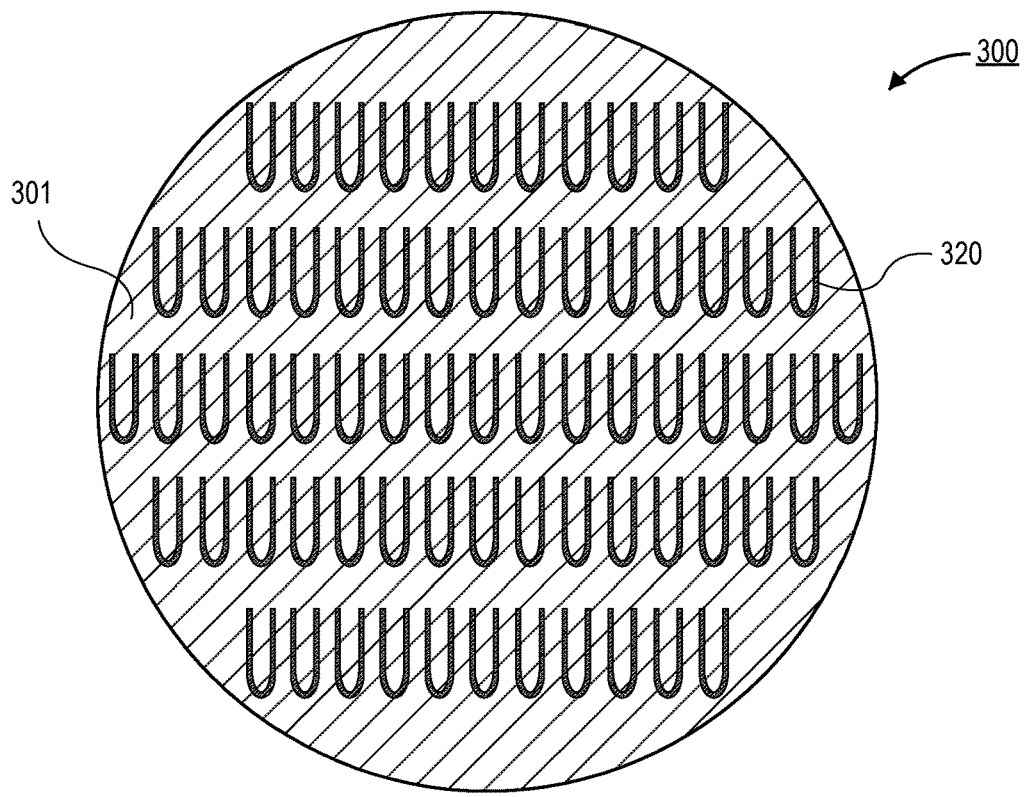
FIG. 3A is a plan view illustration of a substrate with a plurality of sensor devices distributed in a grid across a surface of the substrate, in accordance with an embodiment.

Referring now to FIG. 3A, a plan view illustration of a sensor device 300 is shown, in accordance with an embodiment. As shown, a plurality of resonators 320 are provided over a surface of the substrate 301. In the illustrated embodiment, the antennas and the supports are omitted in order to not obscure the illustration. However, it is to be appreciated that each resonator 320 may be coupled to an individual antenna and supported by a support. As shown, the resonators 320 may be provided in a grid-like pattern across a surface of the substrate 301. The use of a plurality of resonators 320 allows for the spatial mapping of plasma properties within a chamber. Particularly, when the sensor device 300 is inserted into a chamber with a known orientation, the sensor device 300 allows for an accurate mapping of the plasma properties within a chamber. The resolution of the plasma mapping may be increased by providing more resonators 320. For example, the number of resonators 320 may be ten resonators 320 or more. In some embodiments, there may be one hundred or more resonators 320 in the sensor device 300.

In FIG. 3A, each of the resonators 320 have a substantially uniform size and shape. However, it is to be appreciated that embodiments are not limited to such configurations. For example, FIG. 3B provides an illustration of a sensor device 300 that has resonators 320 with non-uniform shapes and sizes.

Figure 3B:
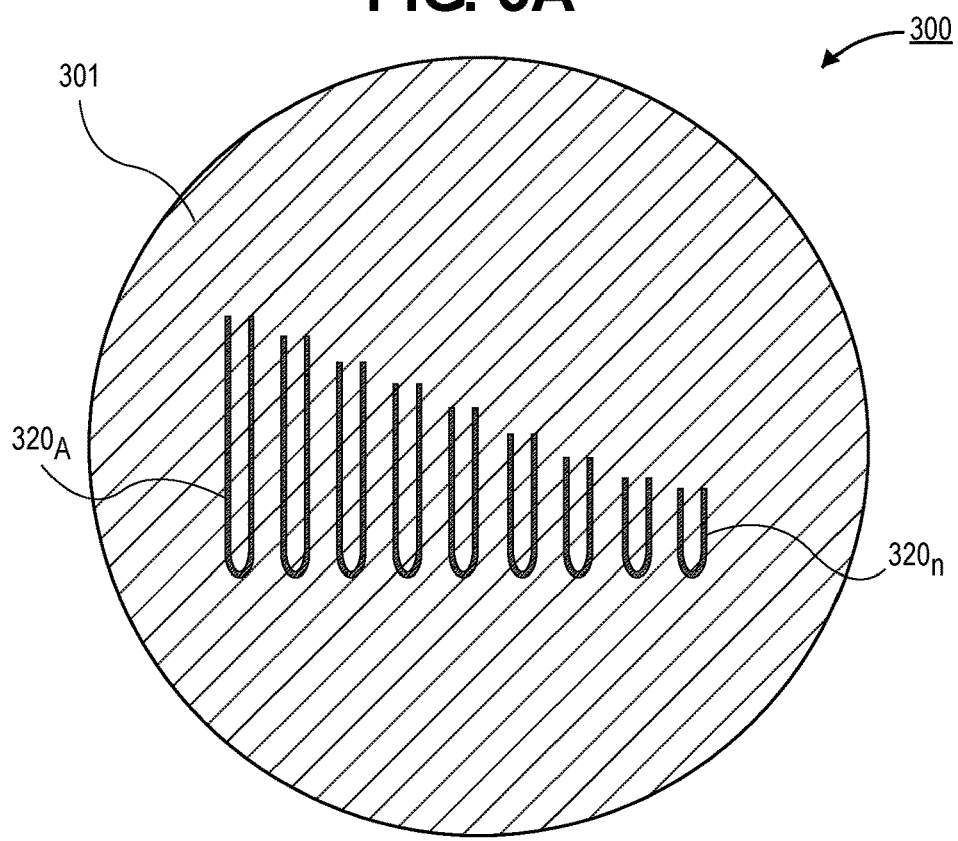
FIG. 3B is a plan view illustration of a substrate with a plurality of sensor devices with resonators that have tines of different lengths, in accordance with an embodiment.

Referring now to FIG. 3B, a plurality of resonators $320_A$-$320_n$ are provided over a substrate 301. As shown, the resonator $320_A$ has tines with a first length, and the resonator $320_n$ has tines with a second length that is smaller than the first length. The resonators 320 between resonator $320_A$ and $320_n$ may also have tines with non-uniform lengths. While showing all of the resonators 320 as having different length tines, it is to be appreciated that some of the resonators 320 may have the same length of tines. For example, a first set of resonators 320 may have tines with a first length, and a second set of resonators 320 may have tines with a second length.

The use of multiple different sized resonators 320 may allow for tuning to different frequency ranges. That is, a single sensor device 300 may be able to detect a plurality of different resonant frequencies. This allows for an increase in the measureable range of plasma parameters. For example, relatively longer tines are tuned to lower frequencies than relatively shorter tines. By including both short tines and long tines, multiple frequencies can be used to determine plasma properties.

Figure 3C:
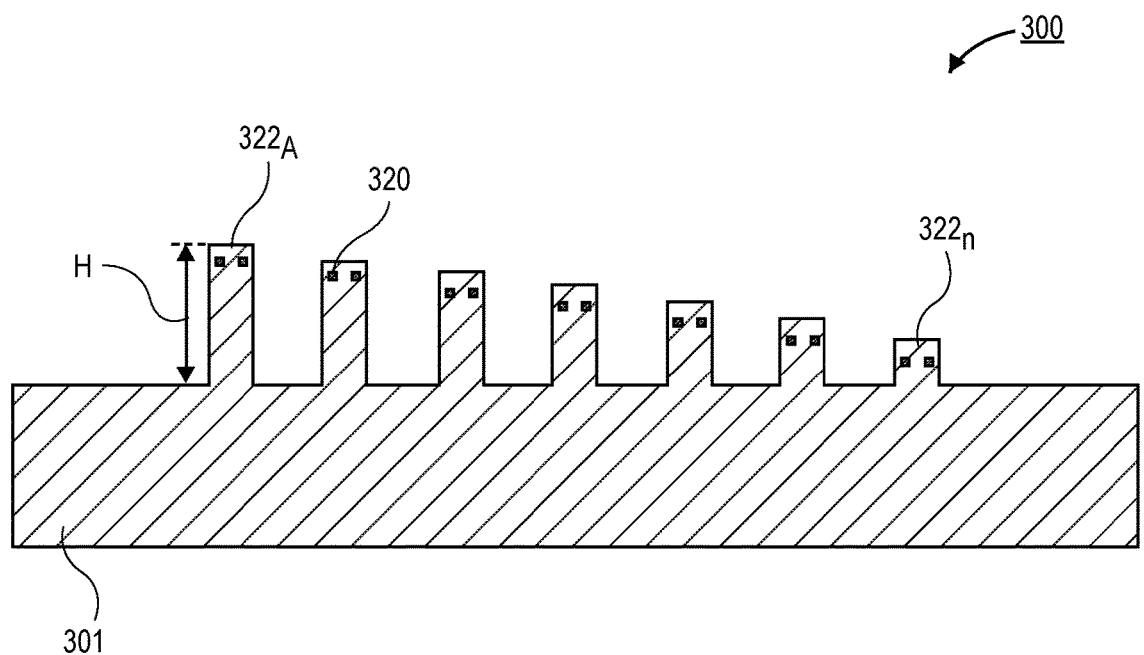
FIG. 3C is a cross-sectional illustration of a substrate with a plurality of sensor devices with holders that support the resonators at different heights above the substrate, in accordance with an embodiment.

Referring now to FIG. 3C, a cross-sectional illustration of a sensor device 300 is shown, in accordance with an additional embodiment. As shown, a plurality of supports $322_A$-$322_n$ are shown. Each of the supports 322 may have a different height H. Variations in the height H can provide different standoff heights to the resonators 320. Providing different heights H allows for plasma properties to be detected at different z-heights within the discharge. As such, in addition to X-Y spatial information about a plasma, different Z axis spatial information may also be detected.

As shown, the support $322_A$ has a first height, and the support $322_n$ has a second height that is smaller than the first height. The supports 322 between support $322_A$ and $322_n$ may also have non-uniform heights. While showing all of the supports 322 as having different heights, it is to be appreciated that some of the supports 322 may have the same height. For example, a first set of supports 322 may have a first height, and a second set of supports 322 may have a second height. In an embodiment, the height H may be between approximately 1 mm and approximately 25 mm. Though, it is to be appreciated that smaller or larger heights H may also be used in other embodiments.

Figure 4:
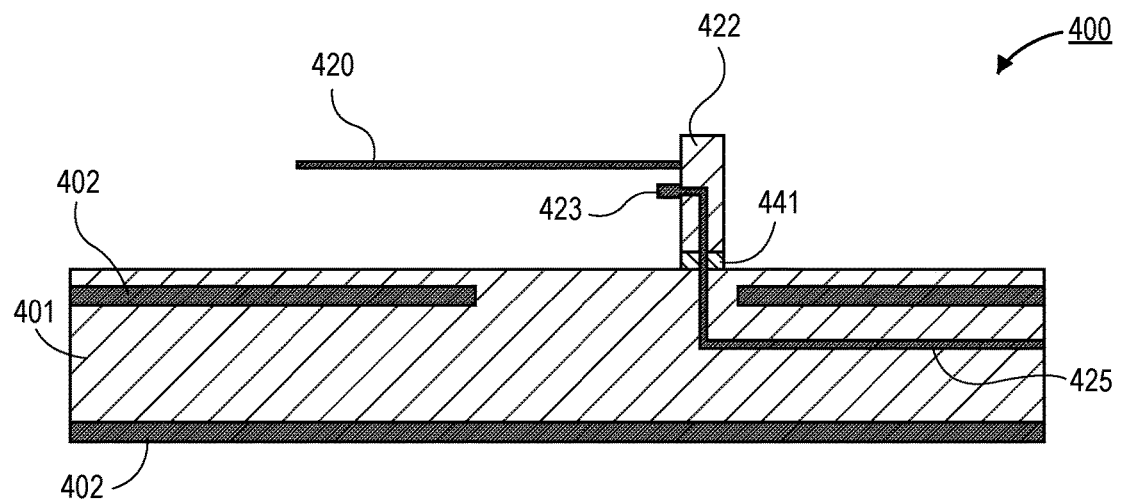
FIG. 4 is a cross-sectional illustration of a sensor device that is removably attached to the substrate with a connector, in accordance with an embodiment.

Referring now to FIG. 4, a cross-sectional illustration of a sensor device 400 is shown, in accordance with an embodiment. In an embodiment, the sensor device 400 comprises a substrate 401. Ground planes 402 may be embedded in the substrate 401. In an embodiment, a support 422 may be attached to the substrate 401 by a connector 441. The connector 441 may be a removable connector. That is, the support 422 may be easily attached and/or detached from the substrate 401. In addition to mechanical coupling, the connector 441 may also provide electrical coupling between the support 422 and a transmission line 425 in the substrate 401. For example, the connector 441 may comprise an MMCX connector or the like.

In an embodiment, an antenna 423 may be provided on the support 422. As opposed to embodiments described above, the antenna 423 is above the substrate 401. Providing the antenna 423 on the support 422 allows for a distance between the resonator 420 and the antenna 423 to be controlled independent of the height of the support 422. As such, a high degree of coupling (e.g., inductive coupling) between the antenna 423 and the resonator 420 can be achieved. In an embodiment, the antenna 423 is electrically coupled to the transmission line 425 through a conductive trace in the support 422 and through the connector 441. While the transmission line 425 connection is shown, it is to be appreciated that a connection from the antenna to a ground plane is also provided through the support 422 and the connector 441.

The use of a removable connector provides several benefits. One benefit is that damaged resonators 420 can be removed and replaced without having to scrap the entire sensor device 400. Additionally, the ability to replace resonators 420 allows for different form factor resonators to be swapped in and out to detect different resonant frequencies. Additionally, different height supports 422 can be used to measure plasma properties at different Z-heights within the plasma.

In an embodiment, the sensor devices may include circuitry for driving and sensing the resonance in the resonators. Examples of block diagrams of the circuitry for wireless and wired embodiments are disclosed in FIGS. 5A-5D.

Figure 5A:
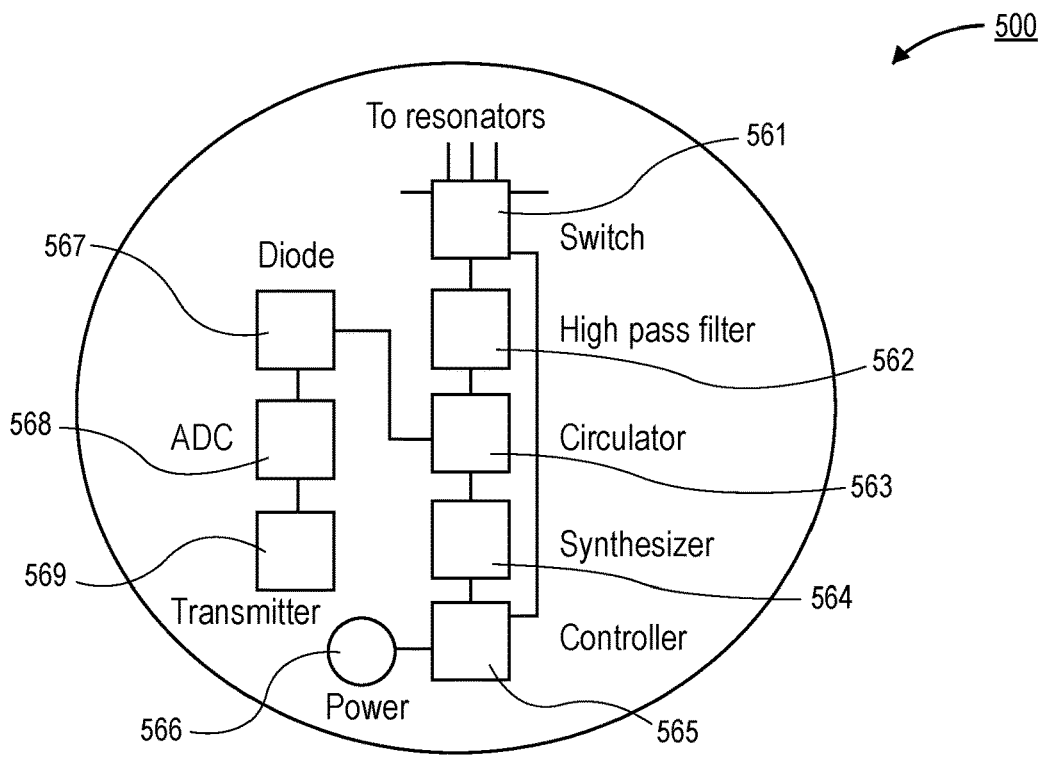
FIG. 5A is a block diagram of the circuitry for driving and sensing sensor devices on a substrate using a wireless configuration, in accordance with an embodiment.

Referring now to FIG. 5A, circuitry for a wireless sensor device 500 is shown, in accordance with an embodiment. As shown, a switch block 561 may be coupled to the plurality of resonators (not shown). The switch block 561 may be coupled to a high pass filter 562, which is in turn coupled to a circulator 563. A synthesizer 564 is coupled to the circulator, and a controller 565 is coupled to the synthesizer 564.

The controller 565 may also be coupled to the switch 561. A power source 566 (e.g., a battery) may be coupled to the controller 565. In an embodiment, a diode 567 is coupled to the circulator 563, and an analogue to digital converter (ADC) 568 is coupled to the diode 567. A transmitter 569 (e.g., a wireless transceiver) is coupled to the ADC 568.

Figure 5B:
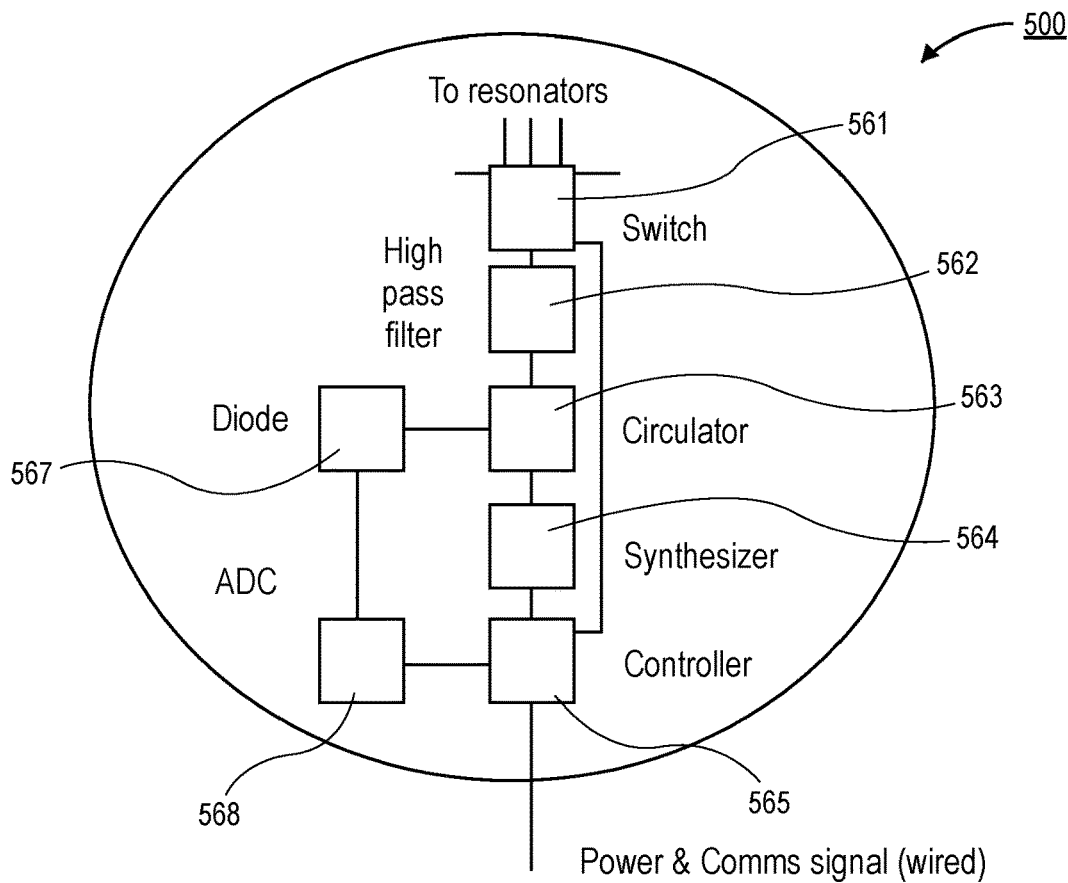
FIG. 5B is a block diagram of the circuitry for driving and sensing sensor devices on a substrate using a wired configuration, in accordance with an embodiment.

Referring now to FIG. 5B, circuitry for a wired sensor device 500 is shown, in accordance with an embodiment. Similar to the wireless sensor device 500 in FIG. 5A, the wired sensor device 500 may comprise a switch 561, a high pass filter 562, a circulator 563, a synthesizer 564, and a controller 565. Power and communications signals may be provided to the controller 565 over a wired connection. The wired sensor device 500 may also comprise a diode 567 and an ADC 568.

Figure 5C:
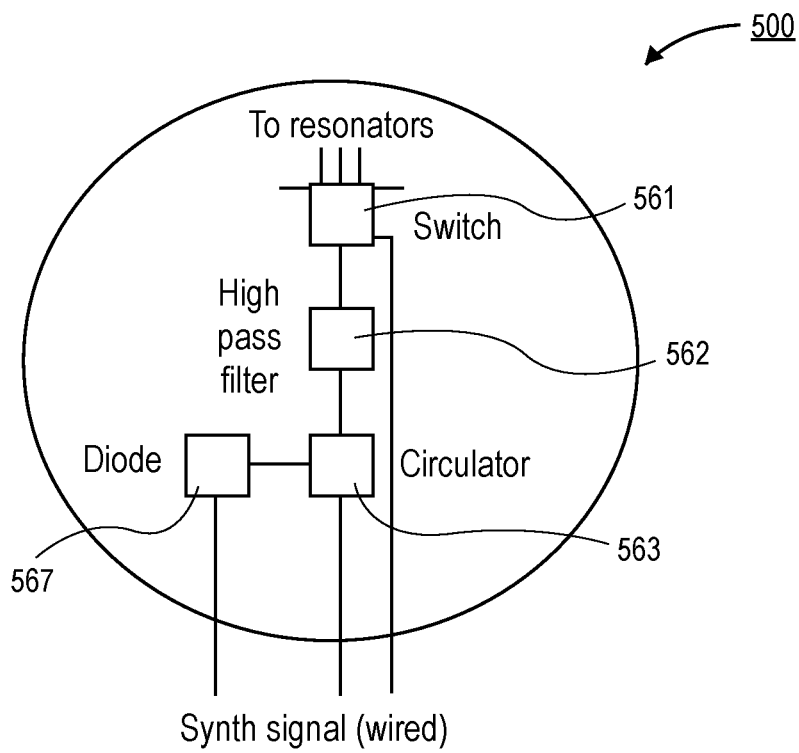
FIG. 5C is a block diagram of the circuitry for driving and sensing sensor devices on a substrate using a wired configuration, in accordance with an additional embodiment.

Referring now to FIG. 5C, circuitry for a wired sensor device 500 is shown, in accordance with an additional embodiment. The wired sensor device 500 may have some circuitry offloaded from the substrate. For example, the controller 565, the synthesizer 564, and the ADC 568 may be offloaded from the wired sensor device 500. As such, the wired sensor device 500 may comprise a switch 561, a high pass filter 562, a circulator 563 and a diode 567.

Figure 5D:
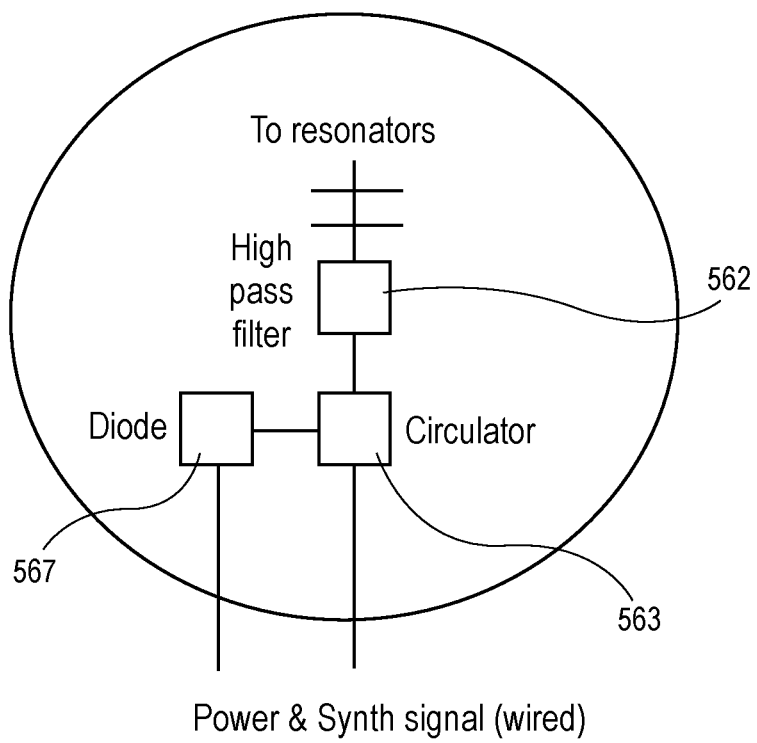
FIG. 5D is a block diagram of the circuitry for driving and sensing sensor devices on a substrate using a wired configuration, in accordance with an additional embodiment.

Referring now to FIG. 5D, circuitry for a wired sensor device 500 is shown, in accordance with yet another additional embodiment. In the wired sensor device 500 of FIG. 5D, the switch is also omitted from the device 500. Such an embodiment may rely on each of the resonators having a different resonant frequency. As such, all of the resonators may be measured simultaneously since they are at different frequencies. As such, the remaining circuitry on the sensor device 500 may include a high pass filter 562, a circulator 563, and a diode 567.

Figure 6:
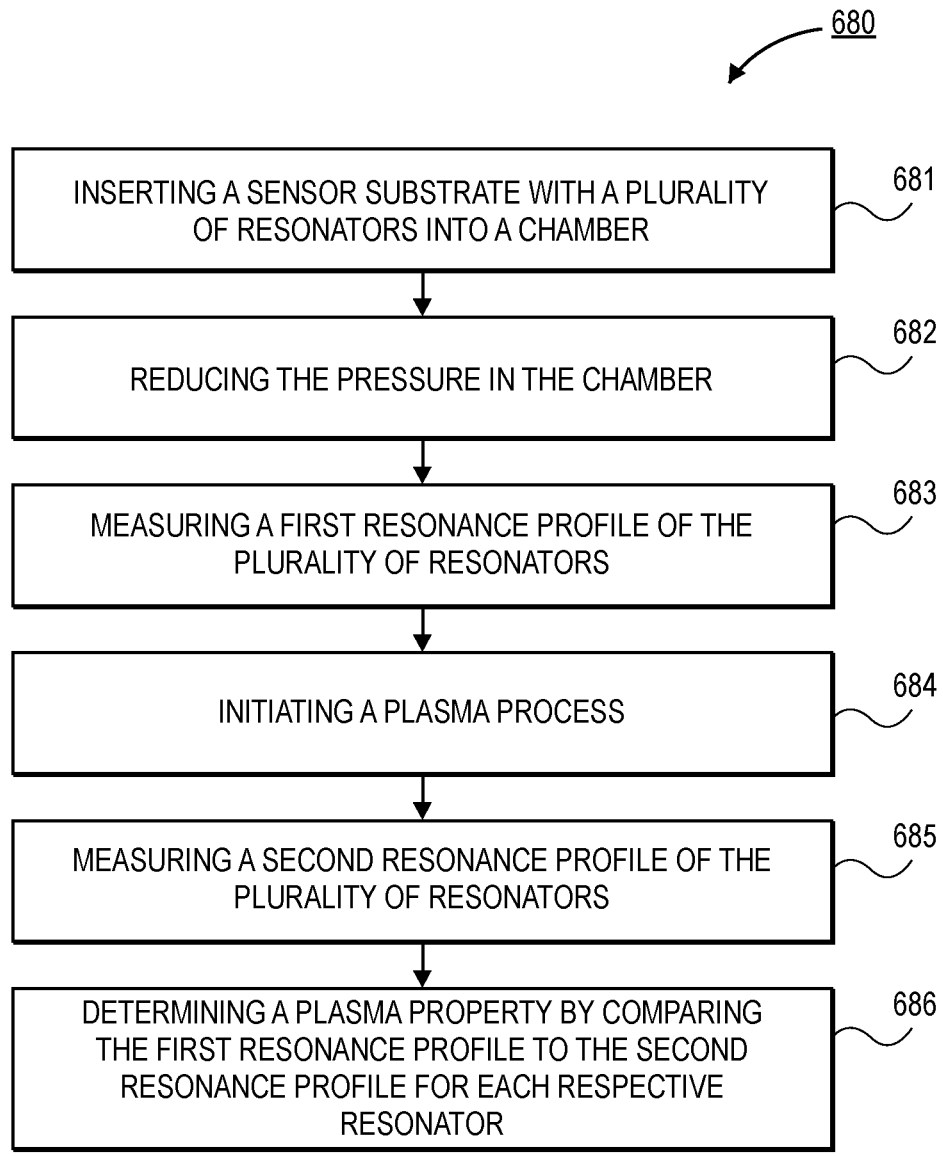
FIG. 6 is a process flow diagram of a method for measuring a plasma parameter in a plasma chamber, in accordance with an embodiment.

Referring now to FIG. 6, a process flow diagram of a process 680 for measuring plasma parameters of a plasma is shown, in accordance with an embodiment. In an embodiment, process 680 may begin with operation 681, which includes inserting a sensor substrate with a plurality of resonators into a chamber. The sensor substrate may be substantially similar to any of the sensor devices described in greater detail above. For example, the resonators may be hairpin resonators that are raised above the substrate by a support. The hairpin resonators may be driven to resonance by an antenna. The resonators may be substantially uniform in structure in some embodiments. In other embodiments, the resonators may have different geometries and/or be positioned at different Z-heights above the sensor substrate.

In some embodiments, the orientation of the sensor substrate in the chamber may also be known. As such, precise spatial resolution of the plasma parameters within the chamber can be obtained. This allows for improved monitoring of a single chamber, and/or allows for chamber matching between different chambers as well.

In an embodiment, the process 680 may continue with operation 682, which includes reducing the pressure in the chamber. In an embodiment, the pressure may be reduced to a pressure that is below approximately 10 Torr, below approximately 1 Torr, or below approximately 100 mTorr. The pressure may be chosen to substantially match the pressure at which the plasma will be struck.

In an embodiment, the process 680 may continue with operation 683, which includes measuring a first resonance profile of the plurality of resonators. In an embodiment, the first resonance profile may be used as a reference point to which subsequent resonance profiles are compared. The first resonance profile may be considered the vacuum profile since there is no plasma present at operation 682.

In an embodiment, the process 680 may continue with operation 684 which comprises initiating a plasma process in the chamber. The plasma process may include the flow of one or more source gasses and striking a plasma from the one or more source gasses. In an embodiment, a height of the resonators above the surface of the sensor substrate may be greater than a Debye length of the plasma formed during operation 684.

In an embodiment, the process 680 may continue with operation 685, which comprises measuring a second resonance profile of the plurality of resonators 685. The second resonance profile will typically be different than the first resonance profile. For example, for an individual resonator, the frequency of the resonance will shift and the width of the peak will increase.

In an embodiment, the process 680 may continue with operation 686, which comprises determining a plasma property by comparing the first resonance profile to the second resonance profile. For example, a shift in the frequency of a given resonator between the first resonance profile and the second resonance profile may be used to determine an electron density. A widening of the resonance peak may be used to determine an electron temperature.

When the absolute position of the sensor substrate is known, the resonance profiles may be used to provide accurate mapping of plasma processes within the chamber. Additionally, chamber matching between different chambers can also be implemented. In some embodiments the plasma parameter information may be used as an input to artificial intelligence (AI) and/or machine learning (MI) algorithms used to control processes in a chamber.

Figure 7:
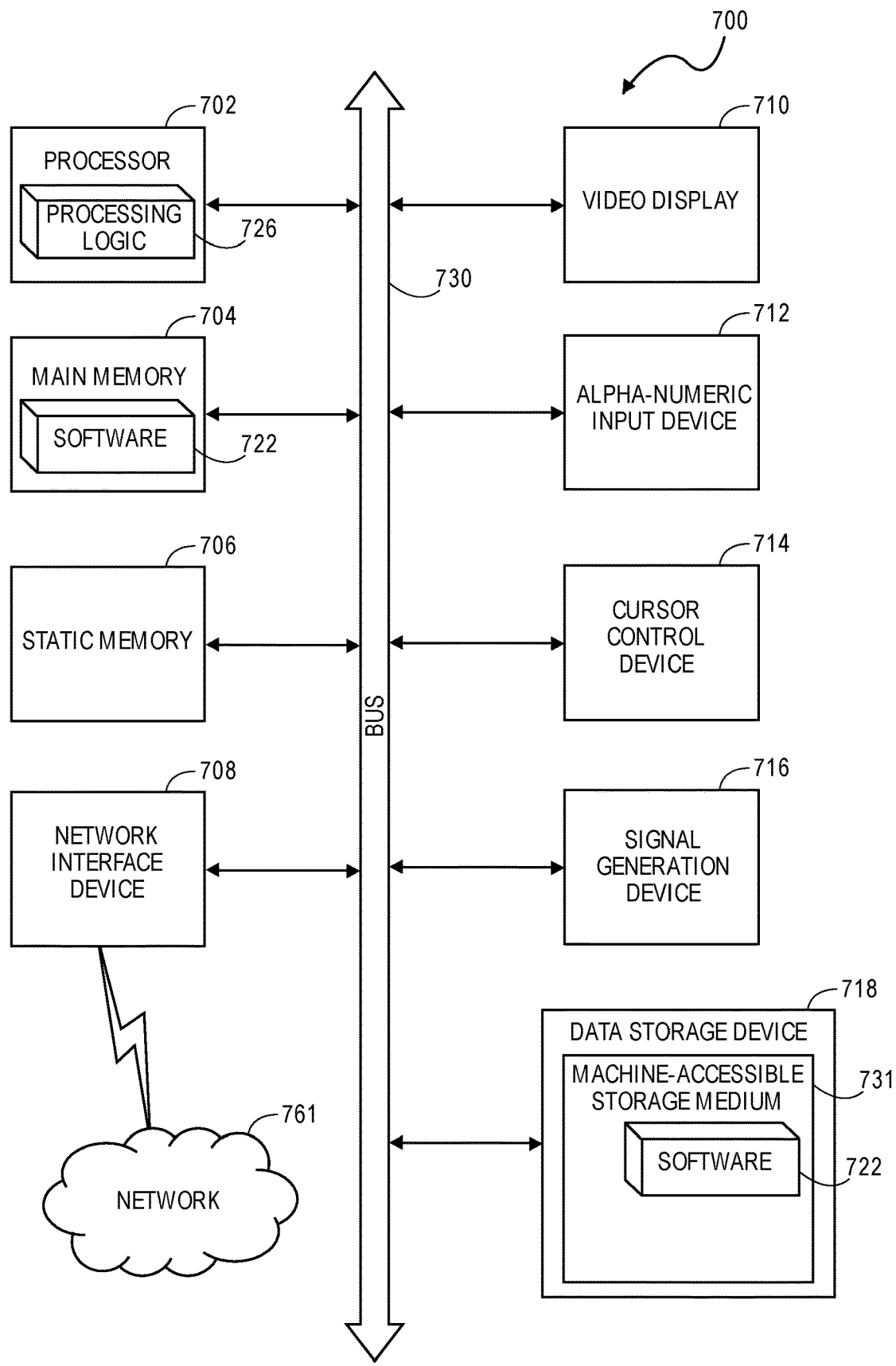
FIG. 7 illustrates a block diagram of an exemplary computer system, in accordance with an embodiment of the present disclosure.

FIG. 7 illustrates a diagrammatic representation of a machine in the exemplary form of a computer system 700 within which a set of instructions, for causing the machine to perform any one or more of the methodologies described herein, may be executed. In alternative embodiments, the machine may be connected (e.g., networked) to other machines in a Local Area Network (LAN), an intranet, an extranet, or the Internet. The machine may operate in the capacity of a server or a client machine in a client-server network environment, or as a peer machine in a peer-to-peer (or distributed) network environment. The machine may be a personal computer (PC), a tablet PC, a set-top box (STB), a Personal Digital Assistant (PDA), a cellular telephone, a web appliance, a server, a network router, switch or bridge, or any machine capable of executing a set of instructions (sequential or otherwise) that specify actions to be taken by that machine. Further, while only a single machine is illustrated, the term "machine" shall also be taken to include any collection of machines (e.g., computers) that individually or jointly execute a set (or multiple sets) of instructions to perform any one or more of the methodologies described herein.

The exemplary computer system 700 includes a processor 702, a main memory 704 (e.g., read-only memory (ROM), flash memory, dynamic random access memory (DRAM) such as synchronous DRAM (SDRAM) or Rambus DRAM (RDRAM), etc.), a static memory 706 (e.g., flash memory, static random access memory (SRAM), MRAM, etc.), and a secondary memory 718 (e.g., a data storage device), which communicate with each other via a bus 730.

Processor 702 represents one or more general-purpose processing devices such as a microprocessor, central processing unit, or the like. More particularly, the processor 702 may be a complex instruction set computing (CISC) microprocessor, reduced instruction set computing (RISC) microprocessor, very long instruction word (VLIW) microprocessor, processor implementing other instruction sets, or processors implementing a combination of instruction sets. Processor 702 may also be one or more special-purpose processing devices such as an application specific integrated circuit (ASIC), a field programmable gate array (FPGA), a digital signal processor (DSP), network processor, or the like. Processor 702 is configured to execute the processing logic 726 for performing the operations described herein.

The computer system 700 may further include a network interface device 708. The computer system 700 also may include a video display unit 710 (e.g., a liquid crystal display (LCD), a light emitting diode display (LED), or a cathode ray tube (CRT)), an alphanumeric input device 712 (e.g., a keyboard), a cursor control device 714 (e.g., a mouse), and a signal generation device 716 (e.g., a speaker).

The secondary memory 718 may include a machine-accessible storage medium (or more specifically a computer-readable storage medium) 732 on which is stored one or more sets of instructions (e.g., software 722) embodying any one or more of the methodologies or functions described herein. The software 722 may also reside, completely or at least partially, within the main memory 704 and/or within the processor 702 during execution thereof by the computer system 700, the main memory 704 and the processor 702 also constituting machine-readable storage media. The software 722 may further be transmitted or received over a network 720 via the network interface device 708.

While the machine-accessible storage medium 732 is shown in an exemplary embodiment to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, and optical and magnetic media.

In accordance with an embodiment of the present disclosure, a machine-accessible storage medium has instructions stored thereon which cause a data processing system to perform a method of measuring plasma parameters in a plasma chamber using a diagnostic substrate with resonators.

Thus, methods for measuring plasma parameters have been disclosed.

What is claimed is:

1. A sensor device, comprising:
a substrate;
a support extending up from the substrate;
a resonator mechanically coupled to the support; and
an antenna that is configured to electromagnetically couple with the resonator, wherein the antenna is connected to a transmission line in the substrate.

2. The sensor device of claim 1, wherein the resonator is a hairpin resonator with a pair of tines.

3. The sensor device of claim 2, wherein a resonant frequency of the resonator is approximately 1 GHz or greater.

4. The sensor device of claim 1, wherein a distance between the resonator and the substrate is greater than a Debye length of a plasma.

5. The sensor device of claim 1, wherein the antenna is embedded in the substrate.

6. The sensor device of claim 1, wherein the antenna is above the substrate and coupled to the support.

7. The sensor device of claim 1, wherein the antenna is a spiral antenna.

8. The sensor device of claim 1, wherein the resonator is an RF resonator.

9. The sensor device of claim 1, wherein the support is removably mounted to the substrate.

10. The sensor device of claim 1, wherein the sensor device is configured to wirelessly communicate with an external device.

11. A method of measuring a plasma, comprising:
inserting a sensor substrate with a plurality of resonators into a chamber;
reducing the pressure in the chamber;
measuring a first resonance profile of the plurality of resonators;
initiating a plasma process;
measuring a second resonance profile of the plurality of resonators; and
determining a plasma property by comparing the first resonance profile to the second resonance profile.

12. The method of claim 11, wherein the plasma property is an electron density.

13. The method of claim 11, wherein the plasma property is an electronic temperature.

14. The method of claim 11, wherein the plasma process includes a desired pulse frequency, a pressure, a gas composition, a power, and an RF frequency.

15. The method of claim 11, wherein the plasma property is used for chamber matching between a plurality of chambers.

16. The method of claim 11, wherein the plasma property is stored as a data point for use in machine learning or artificial intelligence algorithms.

17. A sensor device, comprising:
a substrate;
a plurality of supports extending up from the substrate;
a plurality of resonators, wherein individual ones of the plurality of resonators are coupled to an individual ones of the plurality of supports; and
a plurality of antennas, wherein individual ones of the plurality of antennas are configured to couple with an individual one of the plurality of resonators, and wherein the plurality of antennas are connected to a single transmission line.

18. The sensor device of claim 17, wherein the plurality of supports have non-uniform heights.

19. The sensor device of claim 17, wherein individual ones of the plurality of resonators comprise a pair of tines, and wherein the pairs of tines have a non-uniform length or a non-uniform width.

20. The sensor device of claim 17, further comprising:
circuitry for communicatively coupling the single transmission line to an external device with a wireless or wired connection, wherein the circuitry comprises:
passive RF circuit elements and/or active RF circuit elements.

* * * * *